(12) United States Patent
Choi et al.

(10) Patent No.: US 9,755,188 B2
(45) Date of Patent: Sep. 5, 2017

(54) ORGANIC ELECTRONIC DEVICE (71) Applicant: LG Display Co., Ltd., Seoul (KR)

(72) Inventors: Jun Rye Choi, Daejeon (KR); Jung Hyoung Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/888,287

(22) PCT Filed: Sep. 30, 2014

(86) PCT No.: PCT/KR2014/009232
§ 371 (c)(1),
(2) Date: Oct. 30, 2015

(87) PCT Pub. No.: WO2015/047049
PCT Pub. Date: Apr. 2, 2015

(65) Prior Publication Data
US 2016/0072101 A1 Mar. 10, 2016

(30) Foreign Application Priority Data

Sep. 30, 2013 (KR) .................. 10-2013-0116193
Dec. 10, 2013 (KR) .................. 10-2013-0153464
Sep. 30, 2014 (KR) .................. 10-2014-0131972

(51) Int. Cl.
*H01L 51/52* (2006.01)
*H01L 51/00* (2006.01)

(52) U.S. Cl.
CPC ...... *H01L 51/5268* (2013.01); *H01L 51/0034* (2013.01); *H01L 51/0097* (2013.01); *H01L 51/5256* (2013.01); *H01L 51/5275* (2013.01); *H01L 51/5253* (2013.01); *H01L 2251/5338* (2013.01); *H01L 2251/5369* (2013.01); *Y02E 10/549* (2013.01)

(58) Field of Classification Search
None
See application file for complete search history.

(56) References Cited

U.S. PATENT DOCUMENTS 4,720,432 A     1/1988  VanSlyke et al.
5,686,504 A *  11/1997  Ang .................. C09J 133/08
                                                      522/46

(Continued)

FOREIGN PATENT DOCUMENTS

CN    1914958 A    2/2007
CN  101960919 A    1/2011

(Continued)

OTHER PUBLICATIONS

Chang E.P., "Electro-Optical Light Management Material: Low Refractive Index Pressure Sensitive Adhesives", Avery Research Center, Pasadena CA, Jun. 26, 2010 downloaded from URL<http://web.archive.org/web/20100501000000*/http://www.pstc.org/files/public/Chang07.pdf> on Dec. 11, 2016.*

(Continued)

*Primary Examiner* — Joseph Schoenholtz
(74) *Attorney, Agent, or Firm* — Dentons US LLP (57) ABSTRACT

Provided are an organic electronic device (OED) and a use thereof. The OED, for example, a flexible device, may have excellent light extraction efficiency and durability. The OED may be applied to a lighting device or a light source for a display.

14 Claims, 1 Drawing Sheet

(56) References Cited

U.S. PATENT DOCUMENTS

| | | | |
|---|---|---|---|
| 6,226,890 B1 | 5/2001 | Boroson et al. | |
| 6,808,828 B2 | 10/2004 | Ohata | |
| 2005/0018431 A1 | 1/2005 | Shiang | |
| 2006/0220539 A1 | 10/2006 | Cok et al. | |
| 2006/0250084 A1 | 11/2006 | Cok et al. | |
| 2007/0135552 A1* | 6/2007 | Wrosch | B82Y 30/00 524/443 |
| 2007/0257608 A1* | 11/2007 | Tyan | C03C 17/38 313/506 |
| 2008/0138624 A1* | 6/2008 | Lewis | C23C 18/31 428/412 |
| 2008/0272367 A1 | 11/2008 | Cok | |
| 2010/0068421 A1* | 3/2010 | Tse | C09J 4/00 428/1.54 |
| 2010/0326519 A1 | 12/2010 | Tanase et al. | |
| 2011/0001159 A1* | 1/2011 | Nakamura | B82Y 20/00 257/98 |
| 2011/0165361 A1* | 7/2011 | Sherman | C09J 7/00 428/41.8 |
| 2011/0200293 A1 | 8/2011 | Zhang et al. | |
| 2013/0076235 A1* | 3/2013 | Lee | H01L 51/52 313/504 |
| 2013/0114269 A1* | 5/2013 | Domercq | H01L 51/5215 362/311.05 |
| 2013/0170218 A1* | 7/2013 | Wolk | G02B 6/0036 362/296.01 |
| 2013/0181198 A1* | 7/2013 | Park | H01L 51/5275 257/40 |
| 2014/0054573 A1* | 2/2014 | Tanase | B82Y 20/00 257/40 |
| 2014/0225099 A1 | 8/2014 | Yamae et al. | |
| 2014/0264293 A1* | 9/2014 | Hatwar | H01L 51/5268 257/40 |
| 2014/0264416 A1* | 9/2014 | Lu | G02B 5/0242 257/98 |
| 2015/0141567 A1* | 5/2015 | Hoej | C08G 18/4854 524/507 |
| 2015/0353413 A1* | 12/2015 | Mushiake | C03C 3/097 362/355 |
| 2016/0013432 A1* | 1/2016 | Raguenet | C03C 3/066 257/40 |
| 2016/0111684 A1* | 4/2016 | Savas | H01L 51/5256 257/40 |

FOREIGN PATENT DOCUMENTS

| | | |
|---|---|---|
| CN | 202145468 U | 2/2012 |
| JP | 2-88689 A | 3/1990 |
| JP | 2-191694 A | 7/1990 |
| JP | 2-196885 A | 8/1990 |
| JP | 2-250292 A | 10/1990 |
| JP | 2-255789 A | 10/1990 |
| JP | 2-289676 A | 11/1990 |
| JP | 3-296595 A | 12/1991 |
| JP | 4-96990 A | 3/1992 |
| JP | 5-9470 A | 1/1993 |
| JP | 5-17764 A | 1/1993 |
| JP | 5-202011 A | 8/1993 |
| JP | 6-49079 A | 2/1994 |
| JP | 6-88072 A | 3/1994 |
| JP | 6-92947 A | 4/1994 |
| JP | 6-100857 A | 4/1994 |
| JP | 6-107648 A | 4/1994 |
| JP | 6-132080 A | 5/1994 |
| JP | 6-145146 A | 5/1994 |
| JP | 6-203963 A | 7/1994 |
| JP | 6-206865 A | 7/1994 |
| JP | 6-207170 A | 7/1994 |
| JP | 6-279322 A | 10/1994 |
| JP | 6-279323 A | 10/1994 |
| JP | 6-293778 A | 10/1994 |
| JP | 7-157473 A | 6/1995 |
| JP | 7-179394 A | 7/1995 |
| JP | 7-228579 A | 8/1995 |
| JP | 7-278124 A | 10/1995 |
| JP | 8-22557 A | 1/1996 |
| JP | 8-81472 A | 3/1996 |
| JP | 2597377 B2 | 4/1997 |
| JP | 2000-145627 A | 5/2000 |
| JP | 2001-252505 A | 9/2001 |
| JP | 2004-273137 A | 9/2004 |
| JP | 2006-228519 A | 8/2006 |
| JP | 2007-335253 A | 12/2007 |
| JP | 2010-218738 A | 9/2010 |
| JP | 2012-512518 A | 5/2012 |
| JP | 2012089313 A * | 5/2012 |
| NO | 2013/094617 A1 | 6/2013 |
| WO | 2004/084323 A1 | 9/2004 |

OTHER PUBLICATIONS

Wayback Time Machine record for Chang E.P., "Electro-Optical Light Management Material: Low Refractive Index Pressure Sensitive Adhesives", Avery Research Center, Pasadena CA, Jun. 26, 2010 downloaded from URL<http://web.archive.org/web/20100501000000*/http://www.pstc.org/files/public/Chang07.pdf> on Dec. 11, 2016.*

Bourru, R., "Optical Characterization of Thin Films by Ellipsometry" Thin Film Centre, University of the West of Scotland, Apr. 2011.*

"Pressure-sensitive adhesive", Wikipedia, pp. 1-4.

* cited by examiner

ORGANIC ELECTRONIC DEVICE

This application is a National Stage Application of International Application No. PCT/KR2014/009232, filed on Sep. 30, 2014, which claims the benefit of Korean Patent Application No. 10-2013-0116193, filed on Sep. 30, 2013, Korean Patent Application No. 10-2013-0153464, filed on Dec. 10, 2013 and Korean Patent Application No. 10-2014-0131972, filed on Sep. 30, 2014, all of which are hereby incorporated by reference in their entirety for all purposes as if fully set forth herein.

FIELD

The present application relates to an organic electronic device (OED) and a use thereof.

BACKGROUND

An OED is a device including at least one organic material layer enabling current conduction. Types of the OED include an organic light emitting device (OLED), an organic photovoltaic cell, an organic photo conductor (OPC), or an organic transistor.

Conventionally, a representative OED such as an OLED, sequentially includes a substrate, a transparent electrode layer, an organic layer and a reflective electrode layer. In a structure called as a bottom emitting device, the transparent electrode layer may be formed as a transparent electrode layer, and the reflective electrode layer may be formed as a reflective electrode layer. In addition, in a structure called as a top emitting device, the transparent electrode layer may be formed as a reflective electrode layer, and the reflective electrode layer may be formed as a transparent electrode layer. Electrons and holes are injected by the electrode layer, and recombined in an emitting unit present in an organic layer, thereby generating light. The light may be emitted to the substrate or the reflective electrode layer. In the structure of the OLED, light generated from the emitting unit due to the difference in refractive index between indium tin oxide (ITO) generally used as a transparent electrode layer, the organic layer and the substrate is trapped at an interface between the organic layer and the transparent electrode layer or in the substrate due to total internal reflection, and only a very small amount of light is emitted. Accordingly, while several methods are proposed to solve this problem, the methods that have been proposed so far are applied to structures using a rigid substrate such as a glass substrate, and a variety of research on a structure for a flexible device is progressing.

An important issue to consider for the OED is durability. Since the organic layer or an electrode may be very easily oxidized by an external material such as water or oxygen, it is important to ensure durability with respect to an environmental factor. To this end, for example, structures for preventing permeation of external materials are proposed in the patent documents 1 to 4. Problems relating to the durability can also be more seriously shown in a flexible structure using a base conventionally having a lower barrier property than glass.

PRIOR ART DOCUMENT

Patent Document

PATENT DOCUMENT 1: U.S. Pat. No. 6,226,890
PATENT DOCUMENT 2: U.S. Pat. No. 6,808,828
PATENT DOCUMENT 3: Japanese Patent Laid-Open Application No. 2000-145627
PATENT DOCUMENT 4: Japanese Patent Laid-Open Application No. 2001-252505

DESCRIPTION

Object

The present application is directed to providing an OED and a use thereof. The present application provides an OED having excellent durability and light extraction efficiency when serving as a flexible OLED, and a used thereof.

Solution

Figure 1:
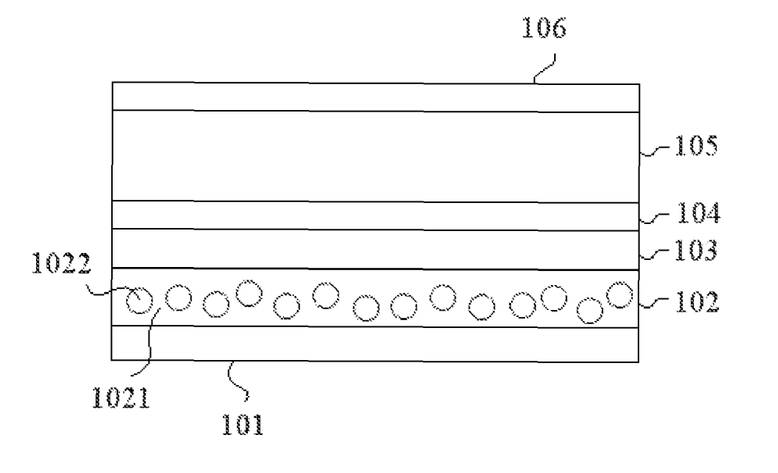
FIG. 1 is a schematic diagram of an illustrative OED.

In one aspect, an illustrative OED may include a barrier film 101, a scattering pressure-sensitive adhesive layer 102, a base film 103, a transparent electrode layer 104, an organic layer 105 and a reflective electrode layer, which are sequentially present in an upper direction as shown in FIG. 1. Layers may be directly stacked without another layer between adjacent layers, or stacked by means of another layer.

As shown in FIG. 1, the OED may include the base film 103, and the barrier film 101 adhered by the scattering pressure-sensitive adhesive layer 102 under the base film 103. Here, the pressure-sensitive adhesive layer 102 may include a pressure-sensitive adhesive binder 1021 and scattering particles 1022, and the scattering particles may have a higher refractive index than the binder. Unless particularly defined otherwise, the refractive index is detected with respect to light having a wavelength of approximately 550 nm.

The term "upper direction" used herein refers to, unless particularly defined otherwise, a direction from the transparent electrode layer to the reflective electrode layer, and the term "lower direction" used herein refers to, unless particularly defined otherwise, a direction from the reflective electrode layer to the transparent electrode layer.

Hereinafter, in the specification, for convenience of the description, in the above structure, a region including all factors (excluding a transparent electrode layer) present under the transparent electrode layer is called as a substrate region, a region including the transparent electrode layer, the reflective electrode layer, and all factors present therebetween is referred to as a device region, and a region including all factors (excluding a reflective electrode layer) present on the reflective electrode layer is referred to as an upper region.

A type of the base film which can be included in the OED is not particularly limited. For example, as the base film, one known to be conventionally used in realization of a flexible device in the art may be used. A representative example of the base film is a thin glass film or a polymer film. As the glass film, a film formed of soda lime glass, barium/strontium-containing glass, lead glass, alumino silicate glass, borosilicate glass, barium borosilicate glass or quartz may be used, and as the polymer film, a film including polyimide (PI), polyethylene naphthalate (PEN), polycarbonate (PC), an acryl resin, poly(ethylene terephthalate) (PET), poly (ether sulfide) (PES) or polysulfone (PS) may be used, but the present application is not limited thereto.

As the base film, a light-transmitting film may be used. The term "light-transmitting film" may refer to a film having a transmittance to any one light in a visible region or light in the entire visible region of, for example, 50, 60, 70 or 80% or more. The base film may be a TFT base film having a thin film transistor (TFT) for driving.

The base film may have a coefficient of thermal expansion (CTE) of approximately 5 to 70 ppm/° C. This range may be advantageous to prevent a defect such as interlayer delamination which can occur in a structure in which an organic material layer and an inorganic material layer are present together.

The base film may have a glass transition temperature of approximately 200° C. or more. The glass transition temperature may be a glass transition temperature of the base film, or a glass transition temperature of the base film on which a buffer layer to be described below is formed. Such a range may be suitable for a high temperature process for deposition or patterning in a process of manufacturing an OED. The glass transition temperature may be, in another example, approximately 210, 220, 230, 240 or 250° C. or more. The upper limit of the glass transition temperature may be, but is not particularly limited to, for example, approximately 400, 350 or 300° C.

In the base film, a root mean square (RMS) may be adjusted within a range of approximately 0.1 to 5 nm. Such an RMS may be that for a surface of the base film, or that for a surface of a buffer layer to be described below of the base film. The range of the surface roughness may be advantageous to improve performance of a layer formed on the buffer layer. For example, when the first inorganic material layer is formed to have a barrier property, the inorganic material layer is formed on a surface having an RMS in the above range, and thus a layer having an excellent water barrier property may be formed. The RMS may be, in another example, approximately 4, 3, 2.5 or 2 nm or less.

The base film may have a refractive index of approximately 1.5, 1.6, 1.7 or 1.75 or more. The term "refractive index" used herein is, unless particularly defined otherwise, a refractive index measured with respect to light having a wavelength of approximately 550 nm. When the OED is an OLED, the range of the refractive index of the base film may be advantageous to increase luminous efficiency of the device. The upper limit of the refractive index of the base film may be, but is not particularly limited to, for example, approximately 2.0.

A thickness of the base film may be selected in a suitable range without particular limitation in consideration of desired performance, for example, flexibility, light extraction efficiency or a barrier property. For example, the base film may have a thickness of approximately 10 to 50 μm or 20 to 30 μm.

The barrier film may be adhered by the scattering pressure-sensitive adhesive layer under the base film. A type of the barrier film that can be used herein is not particularly limited, and for example, a film in which a layer known to prevent water such as an oxide, nitride or oxynitride of silicon may be formed on a base such as a plastic film may be used. In one example, the barrier film may have a structure including a polymer base layer and an inorganic material layer formed on one or both surfaces of the base layer. As the polymer base layer included in the barrier layer, a suitable type may be selected from the above-described base films (the base film 103 in FIG. 1). Accordingly, the polymer base layer may have at least one physical property of the above-described transmittance, coefficient of thermal expansion, glass transition temperature, surface roughness and refractive index of the base layer. Meanwhile, as the inorganic material layer, for example, an inorganic material layer which is the same as a first inorganic material layer included in a substrate region which will be described below may be used.

The barrier film may be adhered by the scattering pressure-sensitive adhesive layer under the base film. The term "scattering pressure-sensitive adhesive layer" used herein may be a pressure-sensitive adhesive layer formed to scatter incident light. The scattering pressure-sensitive adhesive layer may have a haze of, for example, 40, 45 or 50% or more. The light extraction efficiency of the OED may be improved by the pressure-sensitive adhesive layer having a haze in this range. The upper limit of the haze may be, but is not particularly limited to, 90, 85, 80, 75 or 70% or less. In the present application, the haze of the pressure-sensitive adhesive layer is measured by a method disclosed in the following example.

A scattering pressure-sensitive adhesive may be prepared by blending scattering particles with a pressure-sensitive adhesive binder. The term "scattering particles" used herein may be all types of particles which may have a different refractive index from a surrounding material such as the pressure-sensitive adhesive binder and a suitable size, thereby scattering, refracting or diffracting incident light.

As the pressure-sensitive adhesive binder, any of the optically transparent binders known in the art may be used without particular limitation. As the pressure-sensitive adhesive binder, a non-crosslinkable or crosslinkable binder may be used, and the crosslinkable binder may be a heat-curable, vapor-curable, room temperature-curable or active energy ray (e.g., UV or electron beam)-curable pressure-sensitive adhesive binder may be used.

A representative example of the optically transparent pressure-sensitive adhesive binder may be an acrylic pressure-sensitive adhesive binder, an olefin-based pressure-sensitive adhesive binder or a rubber-based pressure-sensitive adhesive binder, and all types of such binders may be used in the present application. In terms of easy obtainment and application, and easy adjustment of the relationship in refractive index between scattering particles to be described below, an acrylic pressure-sensitive adhesive binder may be used. As the acrylic pressure-sensitive adhesive binder, a conventional type, for example, one including a (meth) acrylic acid ester monomer as a main unit, and also having various crosslinkable functional groups when needed. In addition, in terms of adjusting the haze of the pressure-sensitive adhesive layer and the relationship in refractive index between scattering particles to be described below, the pressure-sensitive adhesive binder may have a refractive index of approximately 1.2 to 1.5 or 1.2 to 1.45.

As the scattering particles included in the pressure-sensitive adhesive layer, particles having a different refractive index from the pressure-sensitive adhesive binder may be used. In consideration of suitable light extraction efficiency according to a location including the pressure-sensitive adhesive layer, the scattering particles may have a higher refractive index than the pressure-sensitive adhesive binder. In the structure of the OED of the present application, when the pressure-sensitive adhesive layer includes the scattering particles having a higher refractive index than the pressure-sensitive adhesive binder, considerably high light extraction efficiency may be exhibited in the same haze range, compared to when the pressure-sensitive adhesive layer includes scattering particles having a lower refractive index than the pressure-sensitive adhesive binder. In one example, a difference (A-B) between a refractive index (A) of the scattering particles and a refractive index (B) of the pressure-sensitive adhesive binder may be approximately 0.05, 0.1, 0.3 or 0.5 or more. In addition, the upper limit of the difference in refractive index may be, but is not particularly limited to, approximately 1.5, 1.3 or 1 or less. Within such a range, the haze of the pressure-sensitive adhesive layer may be defined in a suitable range, and more excellent light extraction efficiency may be ensured even in a haze range at a suitable level.

A size of the scattering particles may be suitably adjusted without particular limitation. However, when the scattering particles have a very small size compared to that of a wavelength of the incident light, it may be difficult to ensure a scattering effect, and thus the scattering particles may have an average particle diameter of, for example, 50, 100, 500 or 1,000 nm or more. The average particle diameter of the scattering particles may be, for example, 10,000 nm or less.

Such scattering particles may be alumina, alumino silicate, titanium oxide or zirconium oxide, and as long as particles satisfy the above-describe condition, a specific type is not particularly limited. As particles capable of easily ensuring a high refractive index, rutile-type titanium oxide may be used, and such particles may also be used in the present application.

A ratio of the scattering particles in the pressure-sensitive adhesive layer may bring the above-described haze, and is not particularly limited as long as the ratio is adjusted without departing pressure-sensitive adhesive performance of the pressure-sensitive adhesive binder.

The pressure-sensitive adhesive layer may include an additional component such as a crosslinking agent such as a thermal crosslinking agent or an optical crosslinking agent crosslinking the pressure-sensitive adhesive binder, in addition to the above components.

As another component which can be included in the pressure-sensitive adhesive layer, a water-proof material may be used. The term "water-proof material" used herein may include a component capable of adsorbing or removing water or vapor permeated from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be, but is not limited to, lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

In addition, a ratio of the water-proof material is not particularly limited, may ensure a desired water barrier property, and may be adjusted without reducing a scattering property and a pressure-sensitive adhesive property.

The substrate region of the OED of the present application may include an inorganic material layer formed on the base film as an additional component. As described above, components for the inorganic material layer which will be described below may also be applied to the inorganic material layer of the above-described barrier film. In addition, to be distinguished from an inorganic material layer which may be formed on a reflective electrode layer that will be described below, hereinafter, the inorganic material layer included in the substrate region may be referred to as a first inorganic material layer.

The term "inorganic material layer" used herein may be a layer including 50% or more or 60% of an inorganic material based on a weight. The inorganic material layer may only include an inorganic material, or include another component such as an organic material as long as including an inorganic material in the above range. The first inorganic material layer may be, for example, a barrier layer. The term "barrier layer" used herein may be layer capable of preventing, inhibiting, or reducing the permeation of an external factor, for example, water or vapor, which can have a bad influence on the performance of the device such as an organic layer. For example, the barrier layer may have a water vapor transmission rate (WVTR) of $10^{-4}$ g/m$^2$/day or less. In the specification, the WVTR may be a value measured using a measurer (for example, PERMATRAN-W3/31, MOCON, Inc.) at 40° C. and a relative humidity of 90%.

The barrier layer may be formed of any one of the materials known to reduce, prevent, or inhibit the permeation of the external factors such as water and oxygen. The material may be a material known as a metal such as In, Sn, Pb, Au, Cu, Ag, Al, Ti or Ni; a metal oxide such as TiO, $TiO_2$, $Ti_3O_5$, $Al_2O_3$, MgO, SiO, $SiO_2$, GeO, NiO, CaO, BaO, $Fe_2O_3$, $Y2O_3$, $ZrO_2$, $Nb_2O_3$ or $CeO_2$; a metal nitride such as SiN; a metal oxynitride such as SiON; a metal fluoride such as $MgF_2$, LiF, $AlF_3$ or $CaF_2$; an absorbing material having an absorbance of 1% or more or a water-proof material having an absorption coefficient of 0.1% or less.

The first inorganic material layer may be formed in a monolayer structure or a multilayer structure. The multilayer structure may include a structure in which the same type or different types of inorganic material layers are stacked, or a structure in which an inorganic material layer and an organic layer are stacked. For example, when the inorganic material layer has a multilayer structure to serve as a barrier layer, every layer should not be formed of a material having a barrier property, and a finally formed multilayer structure exhibits a desired barrier property, some layers in the multilayer structure may be formed as layers not having a barrier property. To prevent propagation of a defect such as a pin hole which may be generated in formation of the inorganic material layer, it is advantageous that the inorganic material layer is formed in a multilayer structure. In addition, the barrier layer having a multilayer structure may also be advantageous to form a barrier layer ensuring the following refractive index.

It may be suitable that the first inorganic material layer may have a relatively small difference in refractive index from that of the base film. For example, the absolute value of the difference in refractive index between the first inorganic material layer and the base film may be approximately 1, 0.7, 0.5, or 0.3 or less. Accordingly, when the base film has a high refractive index as described above, the inorganic material layer may also have a refractive index at the same level. For example, the refractive index of the inorganic material layer may be approximately 1.5, 1.6, 1.7, or 1.75 or more. When the OED is an OLED, the range of the refractive index of the base film may be advantageous to increase the luminous efficiency of the device. The upper limit of the refractive index of the inorganic material layer may be, but is not particularly limited to, for example, approximately 2.0.

The first inorganic material layer may include, for example, a stack structure of a first sub layer and a second sub layer. At least two stack structures may be included.

In one example, the first sub layer may have a first refractive index, and the second sub layer may have a second refractive index. When the layers are stacked, it may be advantageous to ensure a decoupling effect, and adjust the refractive index of the inorganic material layer within the above-described range. The absolute value of a difference in the first refractive index and the second refractive index may be, for example, in a range of 0.1 to 1.2. Each range of the first and second refractive indexes is not particularly limited as long as the above range of the refractive index is ensured. For example, the refractive index of the first sub layer may be in a range of 1.4 to 1.9, and the refractive index of the second sub layer may be in a range of 2.0 to 2.6. Each of the first and second sub layers may be a metal oxide layer. For example, a suitable material for the first sub layer having the above refractive index may be $Al_2O_3$, and a suitable material for the second sub layer may be $TiO_2$. However, various materials may be used as long as each layer has the above-described refractive index and the final stack structure has a barrier property.

In another example, the first sub layer may be a metal layer, and the second sub layer may be an organic silicon layer. The term "metal layer" used herein may be a layer including 40, 50 or 60% or more of a metal based on a weight, and the metal may be included alone, or in the form of a metal oxide or an alloy. According to this stack structure, a suitable decoupling effect may be ensured, and thus a layer may have desired performance, for example, an excellent barrier property. The metal layer may be, for example, a metal oxide layer, and have a refractive index of, for example, approximately 1.4 to 2.6. In one example, the metal layer may be formed of a metal oxide, for example, $Al_2O_3$, or $TiO_2$, which may be used as a material for the above-described barrier layer.

The organic silicon layer may include, for example, a compound of Formula 1 or a compound of Formula 2, or a polymer including a polymerization unit of the compound.

[Formula 1]

[Formula 2]

In Formula 1, $R^1$ may be each independently hydrogen, a hydroxyl group, an epoxy group, an alkoxy group or a monovalent hydrocarbon group, and n may be a number in a range of 1 to 10, 1 to 8, 1 to 6, or 1 to 4.

In Formula 2, $R^d$ and $R^e$ may be each independently hydrogen, a hydroxyl group, an epoxy group, an alkoxy group or a monovalent hydrocarbon group, and o may be a number in a range of 3 to 10, 3 to 8, 3 to 6 or 3 to 4.

The term "monovalent hydrocarbon group" used herein may be, unless particularly defined otherwise, a monovalent residue derived from a compound composed of carbon and hydrogen or a derivative of the compound. For example, the monovalent hydrocarbon group may include 1 to 25 carbon atoms. The monovalent hydrocarbon group may be an alkyl group, an alkenyl group, and alkynyl group or an aryl group.

The term "alkyl group" used herein may be, unless particularly defined otherwise, an alkyl group having 1 to 20, 1 to 16, 1 to 12, 1 to 8, or 1 to 4 carbon atoms. The alkyl group may be a linear, branched, or cyclic type. In addition, the alkyl group may be optionally substituted with at least one substituent.

The term "alkoxy group" used herein may be, unless particularly defined otherwise, an alkyl group having 1 to 20, 1 to 16, 1 to 12, 1 to 8, or 1 to 4 carbon atoms. The alkyl group may be a linear, branched, or cyclic type. In addition, the alkoxy group may be optionally substituted with at least one substituent.

The term "alkenyl group" used herein may be, unless particularly defined otherwise, an alkenyl group having 2 to 20, 2 to 16, 2 to 12, 2 to 8, or 2 to 4 carbon atoms. The alkenyl group may be a linear, branched, or cyclic type, and may be optionally substituted with at least one substituent.

The term "alkynyl group" used herein may be, unless particularly defined otherwise, an alkynyl group having 2 to 20, 2 to 16, 2 to 12, 2 to 8, or 2 to 4 carbon atoms. The alkynyl group may be a linear, branched, or cyclic type, and may be optionally substituted with at least one substituent.

The term "aryl group" used herein may be, unless particularly defined otherwise, a monovalent residue derived from a compound including a structure in which a benzene ring is included, or at least two benzene rings are connected, or at least two benzene rings are condensed or bound to each other with sharing one or at least two carbon atoms, or a derivative thereof. In the range of the aryl group described in the specification may include a functional group conventionally called as an aryl group, and an aralkyl group or arylalkyl group. The aryl group may be, for example, an aryl group having 6 to 25, 6 to 21, 6 to 18, or 6 to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

The term "epoxy group" used herein may be, unless particularly defined otherwise, a monovalent residue derived from cyclic ether having three elements for forming a ring or a compound including the cyclic ether. The epoxy group may be a glycidyl group, an epoxyalkyl group, a glycidoxyalkyl group or an alicyclic epoxy group. Here, the alicyclic epoxy group may be a monovalent residue derived from a compound having a structure in which an aliphatic hydrocarbon ring structure is included, and two carbon atoms forming the aliphatic hydrocarbon ring also form an epoxy group. The aliphatic epoxy group may be an aliphatic epoxy group having 6 to 12 carbon atoms, for example, 3,4-epoxycyclohexylethyl group.

A substituent optionally substituted to an epoxy group, an alkoxy group or a monovalent hydrocarbon group may be, but is not limited to, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group or a monovalent hydrocarbon group.

The compound of Formula 1 or 2 may be, but is not limited to, trivinyltrimethylcyclosiloxane, hexamethyldisiloxane or 1,3,5-trivinyl-1,1,3,5,5-pentamethyltrisiloxane.

A thickness of the first inorganic material layer may be suitably selected according to a desired use without particular limitation. For example, the inorganic material layer may have a thickness of approximately 5 to 60 nm or 10 to 55 nm.

In the multilayer structure, a thickness of each sub layer may be in a range of, for example, approximately 0.5 to 10 nm or 0.5 to 5 nm.

To achieve desired performance, for example, an excellent barrier property or refractive index, conditions for forming the inorganic material layer may be adjusted. For example, the inorganic material layer may be formed on a planarized surface, for example, a surface having a root mean square (RMS) of 5, 4.5, 4.0, 3.5, 3.0, 2.5, 2.0, 1.5, 1.0, or 0.5 nm or less. When the inorganic material layer is formed on the planarized surface, a quality of the layer which will be formed may be more improved. The RMS may be adjusted using a material having an excellent planarization degree, or adjusted by a buffer layer which will be described below. Another method for ensuring desired performance, for example, a barrier property is a method of adjusting a temperature in the formation of the inorganic material layer. Generally, the inorganic material layer may be formed by physical or chemical deposition, and in this case, when a deposition temperature is adjusted to a high temperature, for example, 200° C. or more, an excellent barrier property may be ensured.

The inorganic material layer may be formed by physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HVPE), initiated chemical vapor deposition (iCVD), plasma enhanced chemical vapor deposition (PECVD) or atomic layer deposition (ALD). The performance of the inorganic material layer may be maximized by selecting a suitable method from the above methods according to a material for use. In the present application, to form a layer using the above-described material, a CVD method, particularly, ALD or iCVD may be applied. For example, a layer formed of the metal or metal oxide may be formed by ALD, and the organic silicon layer may be formed by iCVD. Here, the term "ALD layer" used herein is a layer formed by ALD, and the term "iCVD layer" is a layer formed by iCVD.

The substrate region including the above-described components may have a haze of 3 to 90, 3 to 85, 3 to 50 or 3 to 30%. Such a haze range may be advantageous to increase light extraction efficiency. To control the haze of the substrate region, the haze of the scattering pressure-sensitive adhesive layer in the substrate region may be adjusted, the haze of the base film may also be adjusted when needed, or a scattering layer may also be applied.

For example, to adjust the haze of the substrate region, the above-described base film may have a haze. However, when the substrate region has a haze only by the scattering pressure-sensitive adhesive layer, the base film does not necessarily have a haze. When having a haze, the base film may have a haze of approximately 3 to 90%. Another lower limit of the haze may be, for example, approximately 5 or 10%. In addition, another upper limit of the haze may be, for example, approximately 85, 80, 75, 70, 65, 60, 55, 50, 45, 40, 35 or 30%. A method of providing a haze to the substrate is not particularly limited, and a conventionally applied method to generate a haze may be used. For example, when the base film is a polymer film, a method of adding scattering particles having a different refractive index from a peripheral polymer matrix and a suitable average particle diameter, or a method of forming a film using a polymer prepared by polymerizing a monomer allowing a polymer to have a haze, for example, a monomer exhibiting a refractive index in a different range from a main chain of the polymer.

The substrate region may include an additional layer, for example, a buffer layer. The buffer layer may be formed to ensure a interlayer cohesive property, or adjust an RMS of the above-described base film. The buffer layer may be formed on the base film, or when the scattering layer is formed, on the scattering layer or between the first inorganic material layer and the transparent electrode layer, but the present application is not limited thereto. As will be described below, when needed, a buffer layer may be formed in the upper region, and in the specification, for convenience of the distinction, the buffer layer formed in the substrate region may be referred to as a first buffer layer, and the buffer layer formed in the upper region may be referred to as a second buffer layer.

The buffer layer may be formed of a high refractive layer. The term "high refractive layer" used herein may be a layer having a refractive index of approximately 1.6, 1.65, 1.7 or 1.75 or more. The upper limit of the refractive index of the high refractive layer may be, but is not particularly limited to, for example, approximately 2.5 or 2.0. For example, such a refractive index may be advantageous to improve light extraction efficiency.

The buffer layer may be formed using a suitable material which can effectively form the buffer layer and suitably ensure an interlayer cohesive property or a planarization degree without particular limitation. The buffer layer may be formed of a metal such as Al, an inorganic material such as SiOx, SiOxNv, SiNx, AlOx, ZnSnOx, ITO, ZnO, IZO, ZnS, MgO or SnOx, a polyimide, a caldo resin having a fluorene ring, an urethane, an epoxide, a polystyrene, a polyamic acid, a polyimide, a polyethylene imine, a polyvinylalcohol, a polyamide, a polythio, a poly((meth)acrylate), or an organic material such as organic siloxane. Here, as the organic silicon, a compound described in the category of the inorganic material layer or a polymer including the compound as a polymerization unit may be used. In another example, the buffer layer may be formed using a material prepared by blending a compound of an alkoxide or acylate of a metal such as zirconium, titanium or cerium with a binder having a polar group such as a carboxyl group or a hydroxyl group. The compound of the alkoxide or acylate may be reacted with the polar group in the binder through condensation, and have a high refractive index by including the metal in a backbone of the binder. As an example of the alkoxide or acylate compound, a titanium alkoxide such as tetra-n-butoxy titanium, tetraisopropoxy titanium, tetra-n-propoxy titanium, or tetraethoxy titanium, titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate may be used.

The buffer layer may be formed by selecting a suitable material from the above-described materials. When the buffer layer requires a high refractive index, a material having a high refractive index selected from the above-described materials, or a material prepared by blending a suitable material selected therefrom with high refractive particles or by introducing a high refractive material such as a Ti precursor to the above material may be used. The term "high refractive particles" used herein may be, for example, particles having a refractive index of 1.5, 2.0, 2.5, 2.6, or 2.7 or more. The upper limit of the refractive index of the high refractive particles may be, for example, selected in the range which may satisfy a desired refractive index. The high refractive particles may have an average particle diameter of, for example, approximately 1 to 100, 10 to 90, 10 to 80, 10 to 70, 10 to 60, 10 to 50, or 10 to 45 nm. The high refractive particles may be alumina, alumino silicate, titanium oxide, or zirconium oxide. As the high refractive particles, for example, particles having a refractive index of 2.5 or more, rutile-type titanium oxide may be used. The rutile-type titanium oxide may have a relatively high refractive index, compared to common particles, and therefore can be controlled to have a desired refractive index even in a relatively small ratio.

A method of forming a buffer layer may be, but is not particularly limited to, for example, a suitable one of the PVD and CVD. In another example, the buffer layer may be formed by preparing a coating solution by blending a metal alkoxide such as titanium alkoxide or zirconium alkoxide with a solvent such as alcohol or water, applying the coating solution, and performing various wet or dry coating methods including a sol-gel coating method of plasticizing the coated solution at a suitable temperature after coating the coating solution.

A thickness of the buffer layer is not particularly limited, and may be suitably selected in consideration of a position at which the buffer layer is formed and required functions. For example, when the buffer layer is formed on the scattering layer to ensure a planarized surface, it may have a relatively large thickness, compared to when the buffer layer is formed on the base film to ensure the planarized surface.

The substrate region may further include a scattering layer to ensure a suitable haze in the substrate region. The term "scattering layer" used herein may be all types of layers formed to scatter, refract, or diffract light incident on the layer. A shape of the scattering layer realized to have the above-described function is not particularly limited.

As an additional layer which can be present in the substrate region, a carrier substrate may be temporarily or permanently adhered under the base film or the barrier film. Conventionally, as the carrier substrate, a rigid substrate such as a glass substrate may be applied.

The device region present on the substrate region may include a transparent electrode layer and a reflective electrode layer, and also include an organic layer present between the transparent and reflective electrode layers. The transparent and reflective electrode layers may be a hole injection or electron injection electrode layer conventionally used in the OED. Any one of the transparent and reflective electrode layers may be formed as a hole injection electrode layer, and the other may be formed as an electrode injection electrode layer.

The hole injection electrode layer may be formed using a material, for example, having a relatively high work function, and when needed, may be formed using a transparent or reflective material. For example, the hole injection electrode layer may include a metal, alloy, electro conductive compound having a work function of approximately 4.0 eV or more, or a mixture of at least two thereof. Such a material may be a metal such as gold, CuI, indium tin oxide (ITO), indium zinc oxide (IZO), zinc tin oxide (ZTO), aluminum- or indium-doped zinc oxide, magnesium indium oxide, nickel tungsten oxide, an oxide such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed of a stack of a metal thin film such as Au, Ag, or Cu and a high refractive transparent material such as ZnS, $TiO_2$, or ITO.

The hole injection electrode layer may be formed by an optional means such as deposition, sputtering, chemical deposition, or an electrochemical means. In addition, the electrode layer formed according to its use may be patterned through known photolithography or a process using a shadow mask.

The electron injection electrode layer may be formed, for example, using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

An organic layer is present between the transparent and reflective electrode layers. The organic layer may include at least two emitting units. In this structure, light generated from the emitting unit may be emitted to the transparent electrode layer by being reflected by the reflective electrode layer.

The organic layer may include at least one emitting unit. The organic layer may include two emitting units, for example, a first emitting unit having a first emission center wavelength and a second emitting unit having a second emission center wavelength when needed. In some cases, at least three emitting units may be included. Here, the first emission center wavelength may be in a different range from the second emission center wavelength. For example, the first emission center wavelength may be a longer wavelength than the second emission center wavelength. For example, a ratio $(\lambda_1/\lambda_2)$ of the first emission center wavelength $(\lambda_1)$ and the second emission center wavelength $(\lambda_2)$ may be in a range of 1.1 to 2. In such a range, a desired color may be realized by mixture of emitting units. The ratio $(\lambda_1/\lambda_2)$ may be, in another example, 1.2, 1.3 or 1.4 or more. In still another example, the ratio $(\lambda_1/\lambda_2)$ may be 1.9 or 1.85 or less. In consideration of the light extraction efficiency, a gap between the emitting unit and the reflective electrode layer may be adjusted. For example, a ratio $(L_1/L_2)$ of a gap $(L_1)$ between the first emitting unit and the reflective electrode layer (e.g., the reflective electrode layer) to a gap $(L_2)$ between the second emitting unit and the reflective electrode layer may be in a range of approximately 1.5 to 20. The ratio $(L_1/L_2)$ may be, in another example, approximately 2 or 2.5 or more. In addition, in another example, the ratio $(L_1/L_2)$ may be approximately 15 or less. For example, when the organic layer including each emitting unit having the gap adjusted as described above and the corresponding emission center wavelength is formed on the substrate region having the above-described haze, the light extraction efficiency of the OED may be improved.

Specific ranges of the emission center wavelength of each emitting unit and the gap between the emitting unit and the reflective electrode layer are not particularly limited as long as they are adjusted to satisfy the above-described ratios. For example, the first emission center wavelength may be in a range of approximately 500 to 700 nm, and the second emission center wavelength may be in a range of approximately 380 to 500 nm. In addition, the gap between the first emitting unit and the reflective electrode layer may be in a range of 150 to 200 nm, and the gap between the second emitting unit and the reflective electrode layer may be in a range of 20 to 80 nm.

For suitable emission, an intermediate electrode layer or a charge-generating layer (CGL) may be further present between the first emitting unit and the second emitting unit.

Accordingly, the emitting units may be divided by the intermediate electrode layer or the CGL having a charge-generating characteristic.

A material constituting the emitting unit is not particularly limited. Fluorescent or phosphorescent organic materials having various emission center wavelengths are known in the art, and a suitable type of the known materials may be selected to form the emitting unit. The material for the emitting unit may be, but is not limited to, an Alq-based material such as tris(4-methyl-8-quinolinolate)aluminum (III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis(2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir$ (bpy), $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (Flrppy), or bis(2-(2'-benzo[4,5-a]thienyl)pyridinato-N,C3') iridium(acetylactonate) ($Btp_2Ir(acac)$). The emitting layer may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emitting characteristic selected from electron accepting organic compounds or electron donating organic compounds, which will be described below.

The organic layer may be formed in various structures further including various other functional layers known in the art, as long as it includes the emitting unit. As a layer included in the organic layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene or phenanthrene, or a derivative thereof; or a heterocyclic compound such as phenanthroline, bathophenanthroline, phenanthridine, acridine, quinoline, quinoxaline or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl)biphenyl, or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting unit, and when needed, may be formed in a suitable part between the emitting layer and the electron injection electrode layer using a known material.

The hole injection layer or hole transport layer may include, for example, an electron donating organic compound. As the electron donating organic compound, N,N', N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene, or 4,4"-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, a π-Conjugated polymer such as polyparaphenylenevinylene and a derivative thereof, a hole transport non-conjugated polymer such as poly(N-vinylcarbazole), or a σ-conjugated polymer of polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic material layer is not particularly limited. Various materials and methods for forming a hole or electron injection electrode layer and an organic layer, for example, an emitting unit, an electron injection or transport layer, or a hole injection or transport layer are known in the art, and all of the methods may be applied to manufacture the OED.

An upper region of the OED may include a second inorganic material layer and a cover film, which are sequentially formed in a top direction.

The second inorganic material layer is present to prevent, inhibit, or reduce the permeation of external materials, thereby obtaining durability, and specific material and forming method may be similar to those described in the category of the first inorganic material layer. However, when the second inorganic material layer is designed to emit light to the substrate region, it is not necessary to form the second inorganic material layer to have a high refractive index like the first inorganic material layer.

A cover film present on the second inorganic material layer may be a structure for protecting an OED, which is, for example, a known barrier film, metal sheet, or conductive film, or a stack structure of at least two thereof. The cover film in the upper region may be adhered on the second inorganic material layer by an adhesive layer, for example, the above-described adhesive layer having a barrier property.

In the upper region, when needed, at least one buffer layer, that is, a second buffer layer may be present. For example, the buffer layer may be present between the reflective electrode layer and the second inorganic material layer. In another example, the upper region may have a structure in which at least two second buffer layers and at least two second barriers are alternately and repeatedly stacked. The buffer layer may serve to reduce a stress generated from the structure of the upper region, prevent the device from being pressed when the cover film is formed on the second inorganic material layer, and/or lower the limit of a temperature at which the second inorganic material layer is formed, and provide a suitable planarized surface such that the second inorganic material layer may have an excellent effect. A specific material and forming method for the second buffer layer maybe similar to those described in the category of the first buffer layer. However, when light is designed to be emitted to the substrate region, the second buffer layer is not necessarily formed to have a high refractive index liked the first inorganic material layer.

To exhibit suitable performance and have a desired function in an entire device structure, the second buffer layer may be an iCVD layer formed by iCVD.

The second buffer layer may include, for example, poly (meth)acrylate or organic silicon.

The poly((meth)acrylate may include, for example, a polymerization unit of a compound of Formula 3. The term "polymerization unit" of a compound may mean that a compound is polymerized and included in a polymer. The poly((meth)acrylate may be a homopolymer of the compound of Formula 3, or a copolymer including another copolymer in addition to the compound of Formula 3.

[Formula 3]

In Formula 3, $R_1$ may be hydrogen or an alkyl group having 1 to 4 carbon atoms, and A may be an epoxy-containing group or an alicyclic monovalent hydrocarbon group.

Here, the epoxy-containing group may be a glycidyl group, a glycidyloxy group, a glycidylalkyl group, a glycidoxyalkyl group or an alicyclic epoxy group. In addition, here, the alicyclic monovalent hydrocarbon group is a monovalent residue derived from a compound in which carbon atoms are connected in a ring shape, but not an aromatic compound, or a derivative thereof. The alicyclic monovalent hydrocarbon group may be an alicyclic monovalent hydrocarbon group having 3 to 20, 5 to 15 or 5 to 12 carbon atoms, and for example, but is not limited to, an isobornyl group, a cyclohexyl group, a norbonanyl group, a norbonenyl group, a dicyclopentadienyl group, an ethynylcyclohexane group, an ethynylcyclohexene group or an ethynyldecahydronaphthalene group.

Meanwhile, as the organic silicon, the material described in the category of the buffer layer in the substrate region may be used.

The second buffer layer formed by iCVD using the above material may have excellent functions in an entire device structure. The second buffer layer may be formed to a suitable thickness of, for example, approximately 200 to 1,000 nm or 200 to 500 nm in consideration of a desired function.

In another aspect, the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights. In still another aspect, the present application provides a lighting device including the OLED. When the OLED is applied to the lighting device or for different uses, other components constituting the device or a method of constituting the device is not particularly limited, but all of optional materials or methods known in the corresponding field may be employed as long as the OLED is used.

Effect

According to the present application, an OED, for example, a flexible device, can have excellent light extraction efficiency and durability. The OED may be applied to a lighting device or a light source for a display.

DETAILED DESCRIPTION OF EXEMPLARY EMBODIMENTS

Hereinafter, illustrative embodiments of the present application will be described in detail with reference to examples according to the present application and comparative examples not according to the present application. However, the scope of the present application is not limited to the embodiments to be disclosed below.

1. Method of Evaluating Haze of Pressure-Sensitive Adhesive Layer

A haze of a pressure-sensitive adhesive layer applied to Example or Comparative Example was evaluated using a haze meter HM-150 according to ASTM D1003.

2. Method of Evaluating Quantum Efficiency

A quantum efficiency of an OED manufactured in Example or Comparative Example was evaluated according to a conventional method using an integrating sphere or an integrating semi-sphere.

Example 1

An OED was manufactured by the following method. As a base film, a polyimide (PI) film having a refractive index of approximately 1.7 was used. The PI film was formed on a carrier substrate such as a glass substrate, and an anode layer (transparent electrode layer) including indium tin oxide (ITO), a hole injection layer including N,N'-di-[(1-naphthyl)-N,N'-diphenyl]-1,1'-biphenyl)-4,4'-diamine (alpha-NPD) and an emitting unit (4,4',4''-tris(N-carbazolyl)-triphenylamine (TCTA):Firpic, TCTA:Fir6) were sequentially formed on the PI film according to a known method. Subsequently, an electron transport compound, 4,4',4''-tris(N-carbazolyl)-triphenylamine (TCTA), and a low refractive material, LiF (refractive index: approximately 1.39), were vacuum-deposited on the emitting unit to have a refractive index of a total layer of approximately 1.66, thereby forming a low refractive organic layer having a thickness of approximately 70 nm. Subsequently, an aluminum (Al) electrode was formed as an electron injection reflective electrode on the low refractive organic layer by vacuum deposition. Afterward, a device was manufactured by delaminating the carrier substrate, and adhering a barrier film under the PI film using a scattering pressure-sensitive adhesive layer. As the scattering pressure-sensitive adhesive, a pressure-sensitive adhesive prepared by blending scattering particles such as titanium oxide particles having a refractive index of approximately 1.9 and an average particle diameter of approximately 200 nm with a known transparent acrylic pressure-sensitive adhesive was used such that the pressure-sensitive adhesive layer had a haze of approximately 52%. When the barrier film was adhered, a thickness of the pressure-sensitive adhesive layer was adjusted to approximately 30 μm.

Example 2

An OED was manufactured by the same method as described in Example 1, except that a pressure-sensitive adhesive layer having a haze of approximately 64% was formed by blending titanium oxide particles, which were the same as used in Example 1, with the same known transparent acrylic pressure-sensitive adhesive (refractive index: approximately 1.47) as applied in Example 1.

Comparative Example 1

An OED was manufactured by the same method as described in Example 1, except that scattering particles (rutile-type titanium oxide particles) were not blended with the same known transparent acrylic pressure-sensitive adhesive (refractive index: approximately 1.47) as applied in Example 1.

Comparative Example 2

An OED was manufactured by the same method as described in Example 1, except that a pressure-sensitive adhesive layer having a haze of approximately 60% was formed by blending silica particles having a refractive index of approximately 1.4 and an average particle diameter of approximately 200 nm, which were the same as used in Example 1, with the same known transparent acrylic pressure-sensitive adhesive (refractive index: approximately 1.47) as applied in Example 1.

Comparative Example 3

An OED was manufactured by the same method as described in Example 1, except that a pressure-sensitive adhesive layer having a haze of approximately 70% was formed by blending silica particles having a refractive index of approximately 1.4 and an average particle diameter of approximately 200 nm, which were the same as used in Example 1, with the same known transparent acrylic pressure-sensitive adhesive (refractive index: approximately 1.47) as applied in Example 1.

Evaluation of Quantum Efficiency

Quantum efficiency of the OED manufactured in the example or comparative example was evaluated, and results thereof are summarized in Table 1.

TABLE 1

|  | Example 1 | Example 2 | Comparative Example 1 | Comparative Example 2 | Comparative Example 3 |
| --- | --- | --- | --- | --- | --- |
| Quantum efficiency (Q.E.(%)) | 46.2 | 43.7 | 33.5 | 38.2 | 39.8 |

As confirmed from Table 1, the OED to which a scattering pressure-sensitive adhesive was applied according to the present application had an excellent effect, compared to a pressure-sensitive adhesive not having a scattering property. Particularly, as comparing Comparative Example 2 with Comparative Example 3, it was confirmed that when the particles in the pressure-sensitive adhesive layer had a higher refractive index than a pressure-sensitive adhesive binder, and a haze at the same level as or a lower level than when the particles in the pressure-sensitive adhesive layer had a lower refractive index than a pressure-sensitive adhesive binder, excellent quantum efficiency was obtained.

EXPLANATION OF THE MARKS

101: the barrier film
102: the scattering pressure-sensitive adhesive layer
1021: the pressure-sensitive adhesive binder
1022: the scattering particle
103: the base film
104: the transparent electrode layer
105: the organic layer
106: the reflective electrode layer

What is claimed is:

1. An organic electronic device (OED), comprising:
a base film;
a transparent electrode layer over a first surface of the base film;
an organic layer having an emitting unit over the transparent electrode;
a reflective electrode layer over the organic layer; and
a barrier film adhered by a scattering pressure-sensitive adhesive layer under a second surface of the base film opposite to the first surface of the base film,
wherein the pressure-sensitive adhesive layer includes a pressure-sensitive adhesive binder and scattering particles having a higher refractive index than the pressure-sensitive adhesive binder,
wherein a first surface of the barrier film is in contact with the scattering pressure-sensitive adhesive layer, and a second surface of the barrier film opposite to the first surface of the barrier film is exposed to an exterior, and
wherein the base film has a haze of 10 to 40%.

2. The device according to claim 1, wherein the base film has a refractive index of 1.5 or more.

3. The device according to claim 1, wherein the pressure-sensitive adhesive layer has a haze of 40% or more.

4. The device according to claim 1, wherein the difference in refractive index between the scattering particles and the pressure-sensitive adhesive binder is 0.05 or more.

5. The device according to claim 1, wherein the pressure-sensitive adhesive binder has a refractive index for light having a wavelength of 550 nm of 1.2 to 1.5.

6. The device according to claim 1, wherein the pressure-sensitive adhesive binder is an acrylic pressure-sensitive adhesive binder, an olefin-based pressure-sensitive adhesive binder or a rubber-based pressure-sensitive adhesive binder.

7. The device according to claim 1, wherein the scattering particles have a refractive index of 1.55 or more.

8. The device according to claim 1, wherein the scattering particles are alumina, alumino silicate, titanium oxide or zirconium oxide.

9. The device according to claim 1, wherein the pressure-sensitive adhesive layer further includes a water-proof material.

10. The device according to claim 1, further comprising: an inorganic material layer disposed between the base film and the transparent electrode layer and having the absolute value of the difference in refractive index from the base film of 1 or less.

11. The device according to claim 10, wherein the first inorganic material layer includes a stack structure of a first sub layer having a first refractive index and a second sub layer having a second refractive index, and has the absolute value of the difference between the first refractive index and the second refractive index of 0.1 to 1.2.

12. The device according to claim 11, wherein the first sub layer has a refractive index of 1.4 to 1.9, and the second sub layer has a refractive index of 2.0 to 2.6.

13. A light source for a display, comprising: the OED of claim 1.

14. A lighting device, comprising: the OED of claim 1.

* * * * *